United States Patent [19]

Berendts

[11] Patent Number: 5,410,804
[45] Date of Patent: May 2, 1995

[54] METHOD FOR MANUFACTURING A SINGLE PRODUCT FROM INTEGRATED CIRCUITS RECEIVED ON A LEAD FRAME

[75] Inventor: Hendrikus T. Berendts, Doornenburg, Netherlands

[73] Assignee: ASM-Fico Tooling B.V., Ad Herwen, Netherlands

[21] Appl. No.: 117,154

[22] Filed: Sep. 14, 1993

[30] Foreign Application Priority Data

Mar. 15, 1991 [NL] Netherlands .................. 9100470

[51] Int. Cl.⁶ .................................... H01R 43/00
[52] U.S. Cl. ................. 29/827; 437/209; 437/220
[58] Field of Search .......... 437/209, 220; 29/827; 140/105

[56] References Cited

U.S. PATENT DOCUMENTS

| | | | |
|---|---|---|---|
| 3,650,232 | 3/1972 | Heinlen | 113/1 R |
| 4,103,718 | 8/1978 | Steigerwald | 140/105 |
| 4,907,628 | 3/1990 | Corey et al. | 140/105 |
| 4,977,442 | 12/1990 | Suzuki et al. | |
| 5,012,664 | 5/1991 | Hembree | 140/105 X |
| 5,078,186 | 1/1992 | Togashi et al. | 140/105 |
| 5,094,982 | 3/1992 | Suzuki et al. | 437/220 X |
| 5,127,447 | 7/1992 | Furudate et al. | 140/105 |
| 5,146,662 | 9/1992 | Fierkens | 437/209 X |
| 5,251,679 | 10/1993 | Schweizer | 29/827 |
| 5,271,148 | 12/1993 | Desrochers et al. | 29/827 |

FOREIGN PATENT DOCUMENTS

| | | | |
|---|---|---|---|
| 0330512A2 | 8/1989 | European Pat. Off. | H01L 23/50 |
| 2498377 | 7/1982 | France | H01L 21/96 |

OTHER PUBLICATIONS

Patent Abstracts of Japan, vol. 10, No. 272, (E-437) (2328), 16 Sep. 1986 & JP A 61 094 349 (Sanken Electric Co. Ltd.), 13 May 1986.
Patent Abstracts of Japan, vol. 7, No. 267, (E-213) (1412), 29 Nov. 1983 & JP A 58 151 047 (Nippon Kogyo K.K.), 8 Sep. 1983.

*Primary Examiner*—Carl J. Arbes
*Attorney, Agent, or Firm*—Limbach & Limbach

[57] ABSTRACT

Encapsulated integrated circuits (chips) (2, 3, 4, 5, 6) are manufactured by separating the encapsulated integrated circuits arranged on a lead frame (1), subsequently cutting away the lead-connecting strips (7) of the individual products, then bending the leads and finally cutting them to length. By subjecting the products individually to the above stated method steps, products in a great variety of dimensions can be processed. The method and device according to the invention are particularly suitable for manufacturing pilot series on laboratory scale.

9 Claims, 5 Drawing Sheets

METHOD FOR MANUFACTURING A SINGLE PRODUCT FROM INTEGRATED CIRCUITS RECEIVED ON A LEAD FRAME

The invention relates to a method and device for manufacturing a single product from integrated circuits received on a lead frame. Up to the present time such products have usually been obtained using fully automatic or semi-automatic devices by cutting away from each product the strips connecting the leads, the so-called dam bars, subsequently bending and cutting to length the connecting strips (leads) and finally separating the individual products from the lead frames. All operations performed on the products are therefore carried out while the products are received in the lead frame. This enables operations to be carried out on groups of leads and to therefore increase the production speed. All of this is only possible however if the lead frames with the integrated, encapsulated circuits thereon are manufactured with very fine tolerances. Such a method is disclosed in EP-A-0 330 512. U.S. Pat. No. 4,103,718 discloses a device for cutting away dam bars of a lead frame. This production method is not suitable for products such as pilot series of for instance 10-1000 products, for example on laboratory scale. The variations in dimensions can be relatively large, for instance because, as a result of tests with other encapsulating material, the shrink of the lead frames differs to that in the case of use of another encapsulating material. In such conditions the devices developed for large-scale use cannot be employed because they are too expensive. Up to the present time pilot series and the like have in practice often be manufactured by hand. This involves much time and manpower.

The invention has for its object to provide a method and means enabling processing of a great variety of products at comparatively low price.

This is achieved according to the invention by applying a method for successively performing on individual products arranged on a support frame with leads and consisting of encapsulated, integrated circuits the following method steps of:
a. cutting individual products out of the lead frame,
b. cutting away lead-connecting strips (dam bars),
c. bending the leads, and
d. cutting the leads to the desired length.

Because the individual product is first separated from the lead frame sufficient "space" is created round the product for it to undergo the subsequent operations. That is, means can be used which are allowed sufficient displacement space at the sides of the product without being obstructed by another product received in a lead frame and located adjacent to the product for machining.

The dam bars are preferably cut through one by one. The leads on one side of a product are bent round in groups.

A device is further provided according to the invention with which it is possible, as a result only of changing a tool, to cut products out of the lead frame, bend the leads and cut the leads to length.

The device further enables adjusting of the tool within a relatively wide range relative to the product so that adaptation to the dimensions of each product, the desired lead length and the like is possible.

A device for performing method step b of the method as according to claim 1 is characterized by a table transportable through a lead pitch, a carriage placed on the table for receiving and clamping a product and a machining member vertically movable relative to the carriage.

The table is further displaceable in a direction perpendicular to the pitch displacement. A cutting member is chosen as machining member.

In order after a machining to obtain sufficient free height for manually displacing or exchanging a product, the machining member is preferably received in a tool holder which is displaceable relative to the member vertically driving the tool holder as desired between an active position and a position located vertically at a higher point relative to the active position.

The displacing of the tool holder takes place using a wedge-shaped control element movable transversely of the tool holder.

The movement of the control element is bounded by a stop placeable in the path of movement.

The driving of the table in the pitch direction takes place using a stepping motor.

A device is further provided according to the invention for performing the method steps a, c and d as according to claim 1, which is characterized by a frame, a table, clamping means on the table for clampingly receiving a product and a machining member movable vertically with respect to the table.

The invention will be elucidated with reference to the drawings of an embodiment.

In the drawings:

FIGS. 1A-5A show details of the method steps according to FIG. 1-4.

Figure 1:
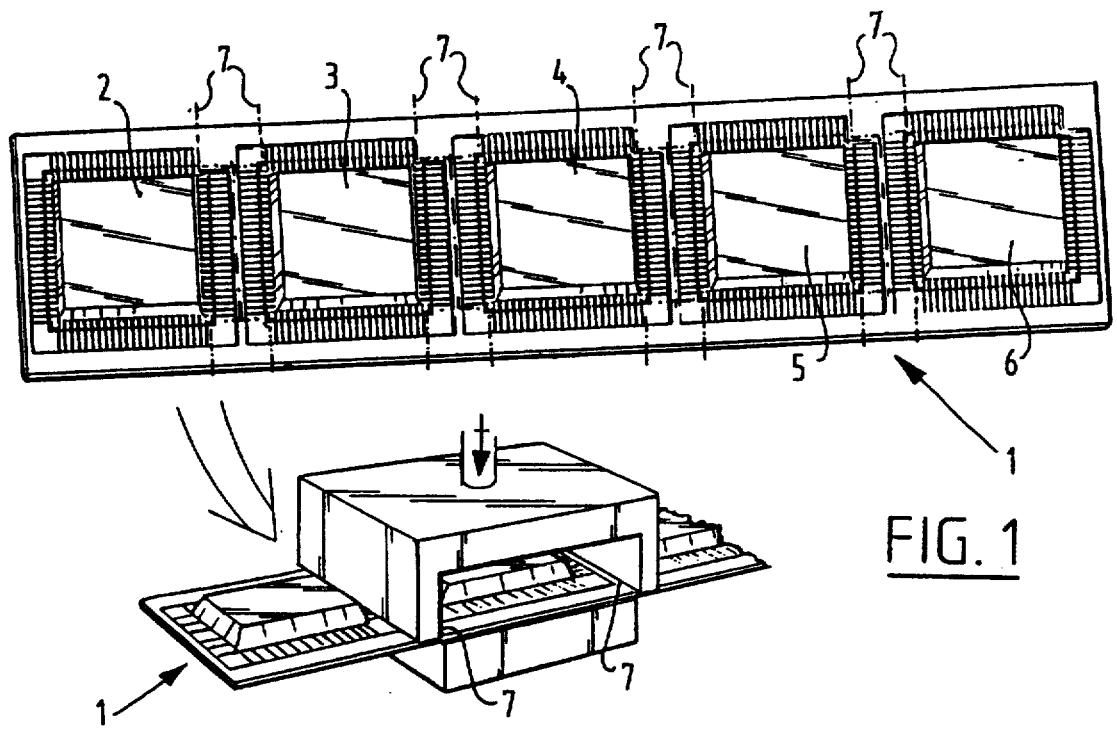
FIGS. 1-4 show schematically the different method steps.

A lead frame 1 comprises a number of mutually connected, encapsulated integrated circuits 2, 3, 4, 5, 6, subsequently referred to as products. According to the invention the products are first separated from the lead frame by cutting through the connection on the boundary line 7 between the products (FIG. 1).

Figure 2:
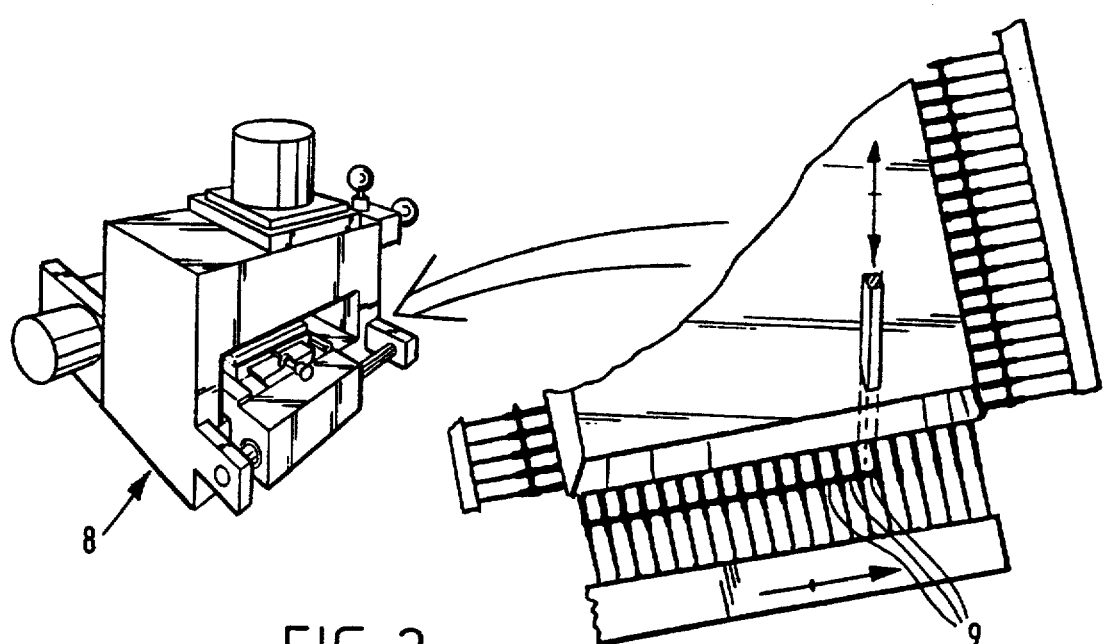
Figure 3:
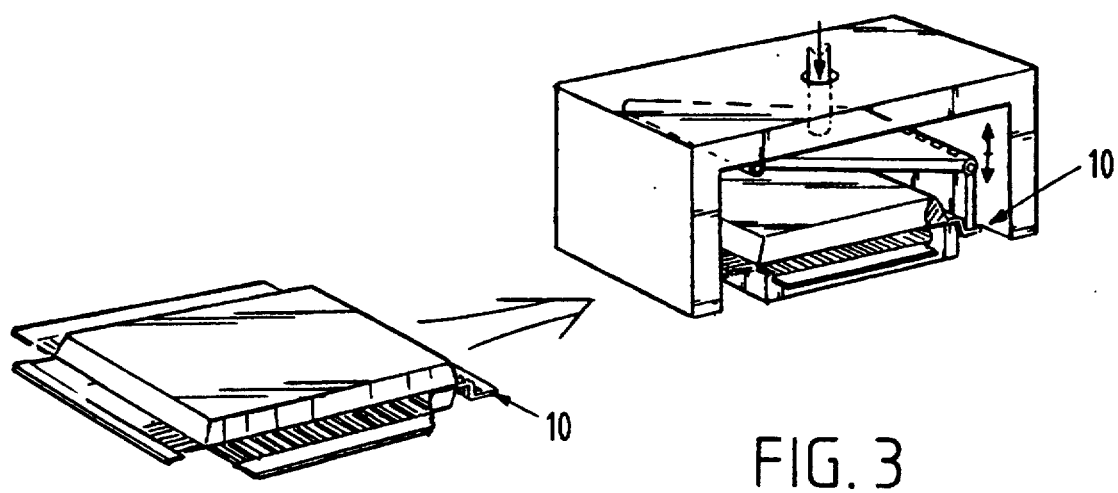
Figure 4:
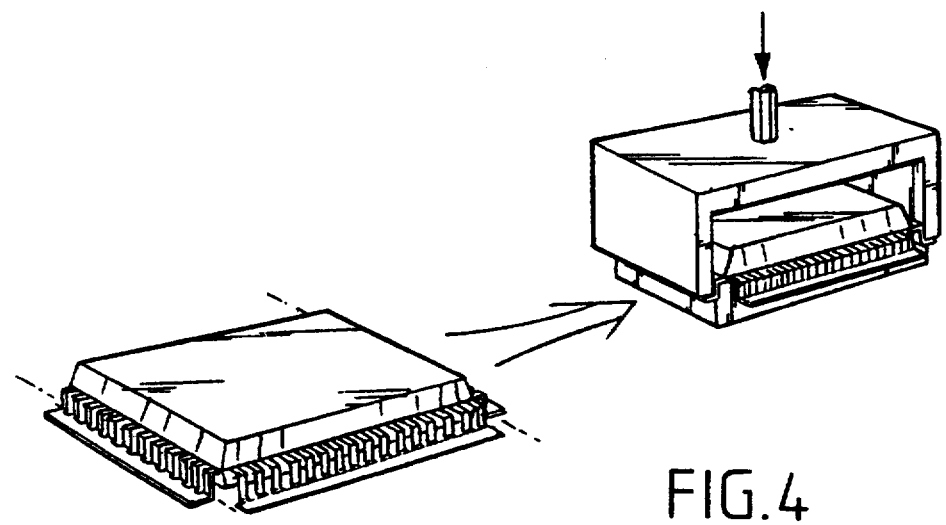

A cut-off product is subsequently machined in a machining device 8. The dam bars 9 are first cut through one by one (FIG. 2). Thereafter the connecting strips (leads) 10 are bent in groups (FIG. 3) and finally the leads are cut to length (FIG. 4).

Figure 2A:
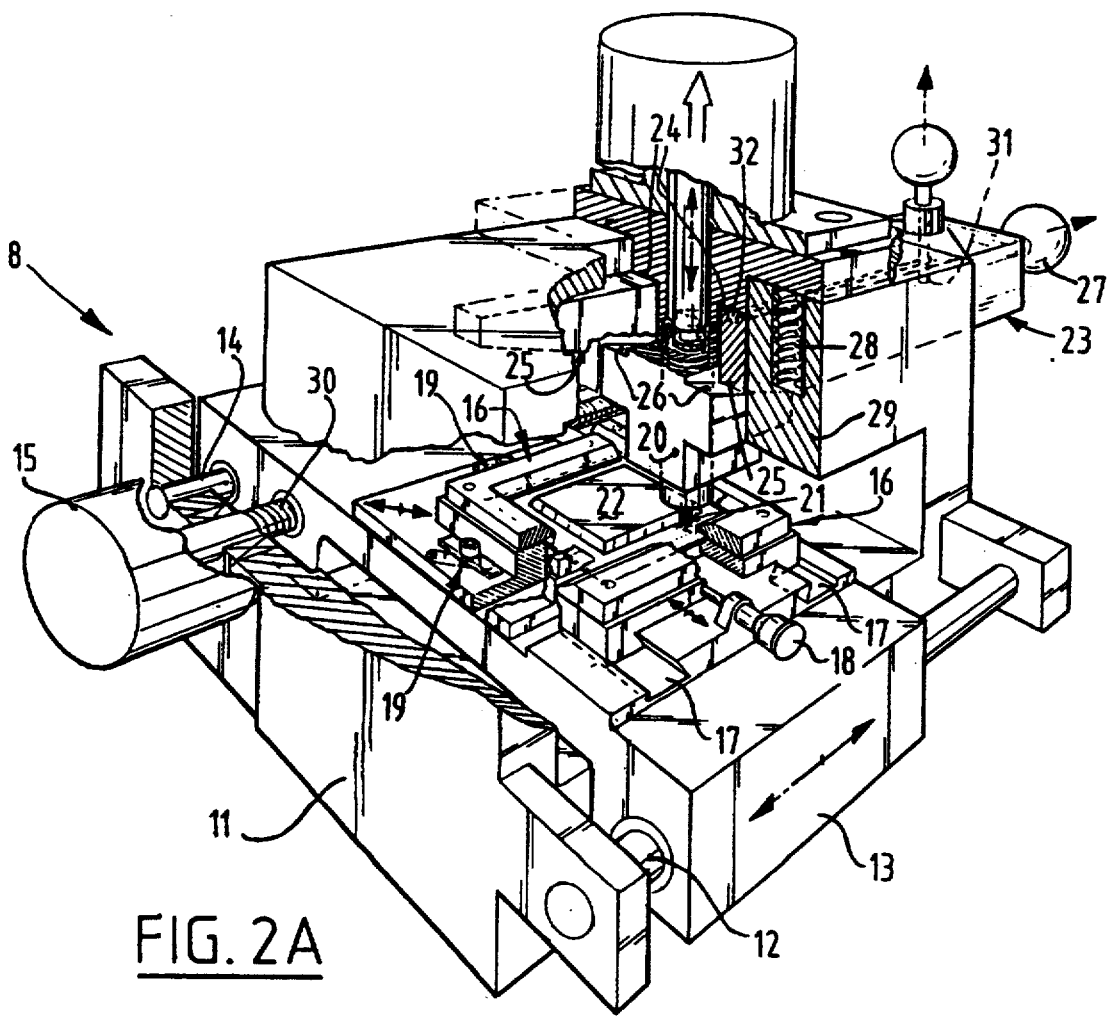

The machining device according to FIG. 2 is shown perspectively in more detail in FIG. 2A.

The machining device 8 is built up of a frame 11 in which guides 12, 14 for a table 13 are received. The table 13 is driven by a stepping motor 15 via a screw spindle 30. Placed on the table 13 are carriages 16, the first of which is displaceable over a guide 17. The carriages 16 comprise means for receiving and clamping a product that has to be machined. The first carriage 16 is adjustable manually by means of an adjusting member 18. In addition a second carriage 16 is displaceable and adjustable in a direction at approximately 45° to the guide 17 using the slot-eccentric connection 19.

Further connected to the frame is a tool holder 20 which is vertically driven by drive means (not drawn). During the vertical stroke the machining member 21 coupled to the tool holder 20 performs a machining on the product 22 clamped onto the carriage 16.

The tool holder 20 is displaceable in its guiding between an active position and a position releasing the product 22. For this purpose a manually operable control element 23 is received slidably in lengthwise direction in a slot 24. The control element 23 has a sloping portion 25 which lies against a correspondingly inclining portion 26 of the tool holder 20. When the control knob 27 is pulled in the direction of the arrow the control element 23 slides outward and the tool holder 20 moves in upward direction under the influence of the force exerted by the spring 28 on the portion 29 of the tool holder 20. Sufficient space is thereby created under the machining member to pick up, turn over or exchange the product 22 by hand.

When the control element 23 is shifted wholly outward the tool holder moves so far in upward direction that the machining member 21 can be exchanged.

The different positions of the control element 23 are fixed by a stop pin 31 which protrudes into a keysway 32.

Using the device according to the invention it is possible to perform all desired operations on a product of which the dimensions lie within wide tolerance limits. Due to the many adjustment options the position on the table with respect to the machining member can be selected subject to the product. When the desired position of the product with respect to the machining member has been assumed the machining can take place, wherein the table with the product can be moved by the stepping motor over the length of a lead pitch.

Figure 5A:
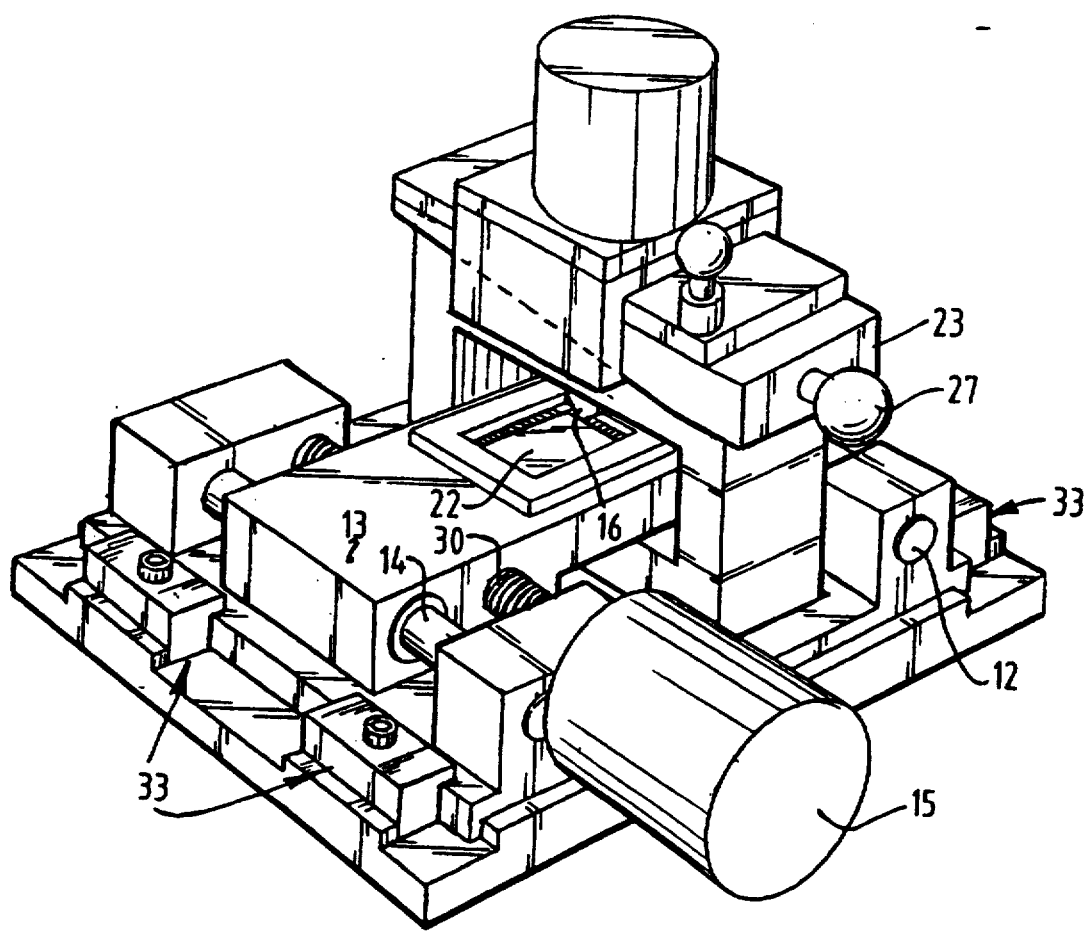

According to FIG. 5A, which shows a variant of the embodiment according to FIG. 2A, the adjusting means 17, 18 are replaced by adjusting blocks 33 which are arranged displaceably on the table.

Figure 1A:
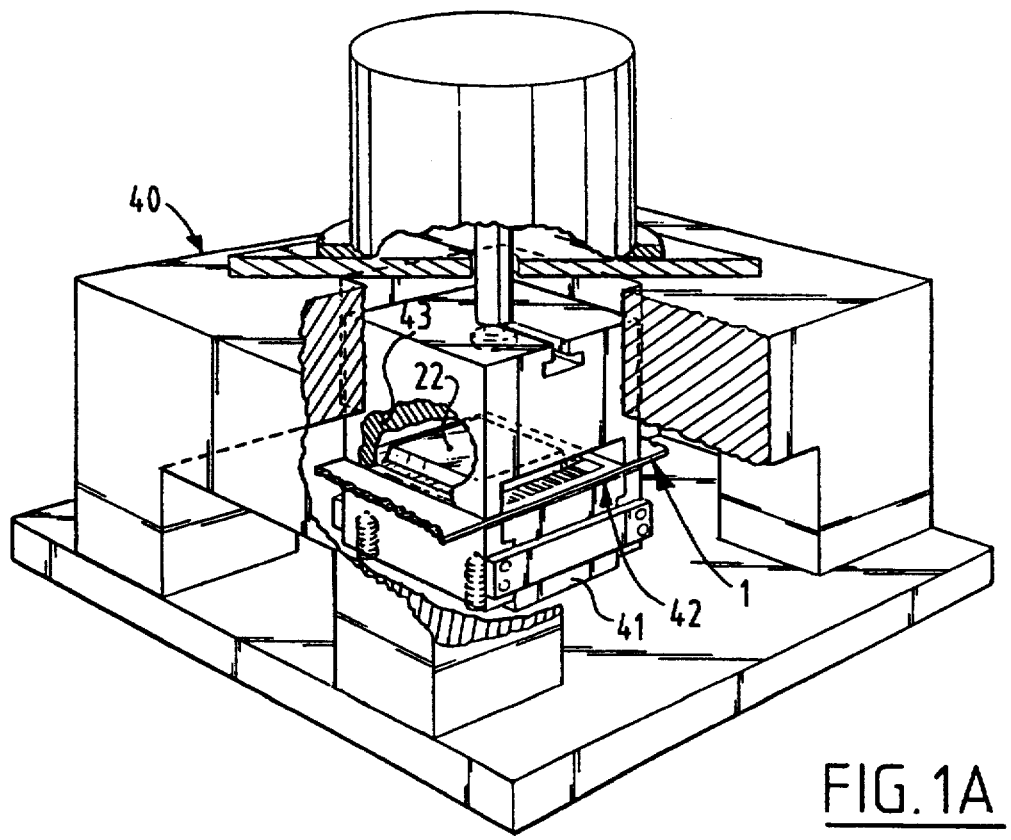
Figure 3A:
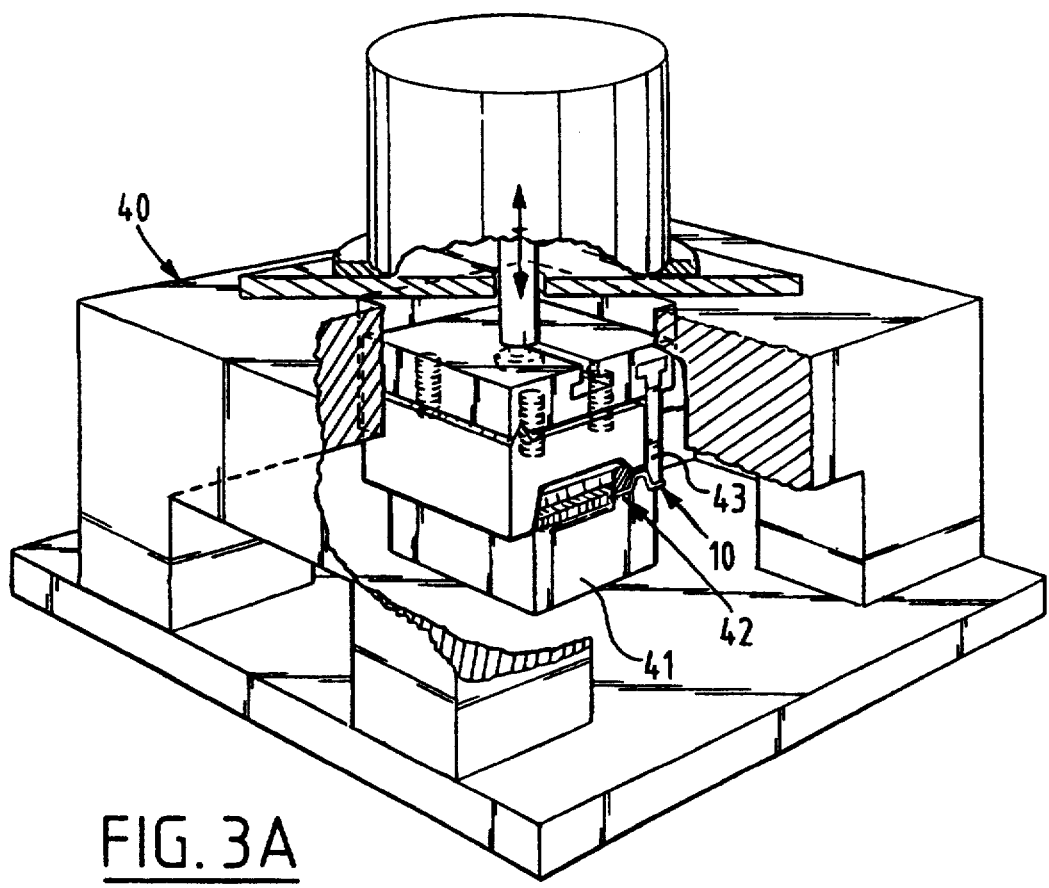
Figure 4A:
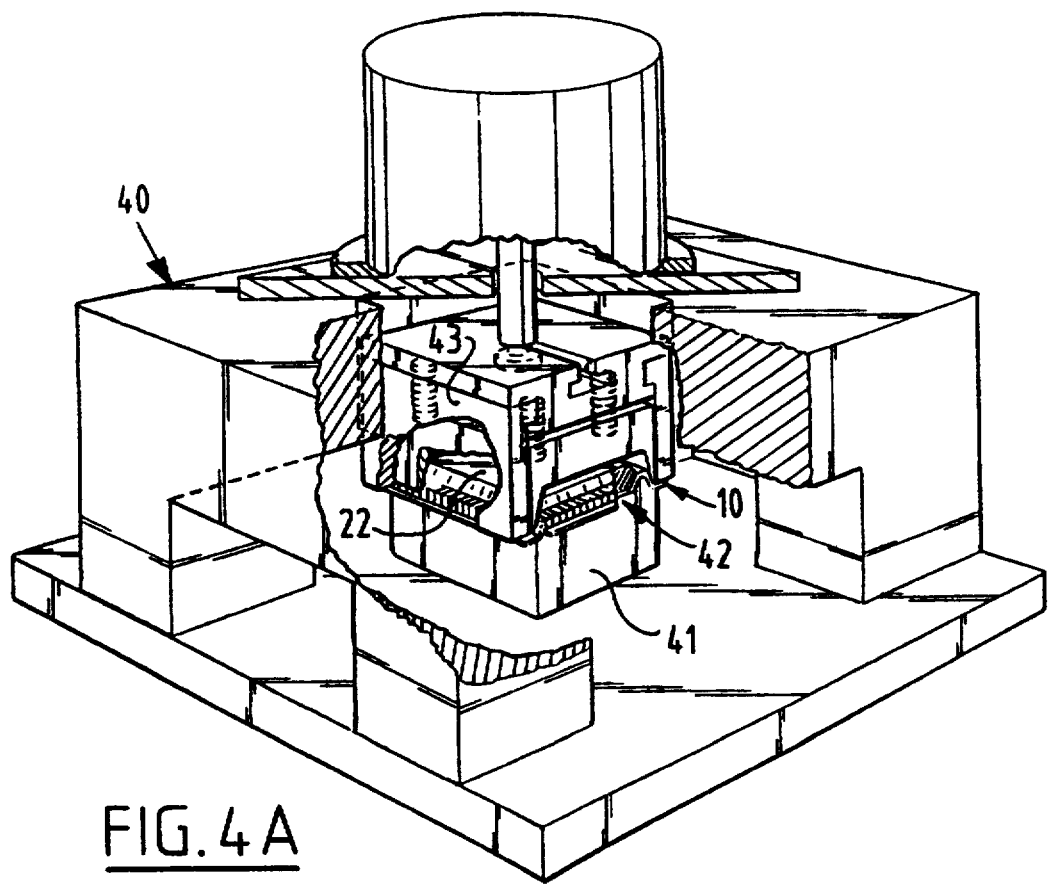

FIGS. 1A, 3A and 4A show in principle the same auxiliary device consisting of a frame 40, a table 41, clamping means 42 and a machining member 43 movable vertically with respect to the table 41.

The product is clamped onto the table and, depending on the operation to be performed, a bending or cutting member is chosen as machining member.

I claim:

1. A method for manufacturing an individual product from an encapsulated, integrated circuit arranged on a support frame with leads, comprising the consecutive steps of:
   a. cutting the individual encapsulated, integrated circuit out of a lead frame;
   b. cutting away lead-connecting strips to form leads;
   c. bending the leads; and
   d. cutting the leads to a desired length.

2. The method of claim 1, wherein the lead-connecting strips are cut away one by one.

3. The method of claim 1, wherein the step of bending the leads comprises bending one group of leads at a time located on one side of the encapsulated, integrated circuit.

4. A device for cutting away strips between leads on an individual encapsulated, integrated circuit arranged on a support frame, comprising:
   a table transportable over one lead pitch and in a direction perpendicular to a pitch displacement of the leads;
   a carriage placed on the table for receiving and clamping an encapsulated integrated circuit; and
   a machining member vertically movable relative to the carriage, wherein the machining member is used to cut the strips between the leads.

5. The device of claim 4, further comprising:
   a tool holder for receiving the machining member so as to be vertically driven by the machining member, the tool holder being displaceable vertically relative to the machining member between an active position and a position located vertically at a higher point relative to the active position.

6. The device of claim 5, wherein the tool holder is displaced using a wedge-shaped control element movable transversely of the tool holder.

7. The device of claim 6, wherein the movement of the control element is bounded by a stop placeable in the path of movement.

8. The device of claim 4, wherein the table is driven in a pitch direction by a stepping motor.

9. A method for manufacturing a single product from an integrated circuit mounted on a lead frame, comprising the consecutive steps of:
   cutting an individual integrated circuit out of a lead frame;
   cutting away a lead-connecting strip which connects the leads of the lead frame, thereby forming a plurality of leads;
   bending the leads; and
   cutting the leads to a desired length.

* * * * *